United States Patent
Tomoda

(10) Patent No.: US 10,233,327 B2
(45) Date of Patent: *Mar. 19, 2019

(54) POLYARYLENE SULFIDE RESIN COMPOSITION

(71) Applicant: TEIJIN LIMITED, Osaka (JP)

(72) Inventor: Takuya Tomoda, Osaka (JP)

(73) Assignee: TEIJIN LIMITED, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/938,326

(22) Filed: Mar. 28, 2018

(65) Prior Publication Data

US 2018/0215918 A1 Aug. 2, 2018

Related U.S. Application Data

(62) Division of application No. 15/039,485, filed as application No. PCT/JP2015/053023 on Jan. 28, 2015.

(30) Foreign Application Priority Data

Feb. 5, 2014 (JP) .................. 2014-020306
Mar. 12, 2014 (JP) .................. 2014-048961

(51) Int. Cl.
| C08J 5/00 | (2006.01) |
| --- | --- |
| C08K 3/04 | (2006.01) |
| C08K 7/02 | (2006.01) |
| C08K 7/06 | (2006.01) |
| C08K 7/14 | (2006.01) |
| C08K 9/02 | (2006.01) |
| H05K 9/00 | (2006.01) |
| C08L 77/10 | (2006.01) |
| C08L 81/02 | (2006.01) |
| C08L 81/04 | (2006.01) |

(52) U.S. Cl.
CPC .............. *C08L 81/04* (2013.01); *C08J 5/00* (2013.01); *C08K 7/02* (2013.01); *C08K 7/06* (2013.01); *C08K 7/14* (2013.01); *C08K 9/02* (2013.01); *C08L 77/10* (2013.01); *H05K 9/009* (2013.01); *C08J 2381/04* (2013.01); *C08K 3/04* (2013.01); *C08L 2201/08* (2013.01); *C08L 2203/206* (2013.01); *C08L 2205/16* (2013.01)

(58) Field of Classification Search
CPC .............. C08J 5/042; C08J 5/043; C08J 5/046
See application file for complete search history.

(56) References Cited

U.S. PATENT DOCUMENTS

| 5,021,497 A | 6/1991 | Ohara et al. |
| --- | --- | --- |
| 2012/0329984 A1 | 12/2012 | Kim et al. |
| 2014/0004308 A1 | 1/2014 | Taniguchi et al. |

FOREIGN PATENT DOCUMENTS

| CN | 103347933 | 10/2013 |
| --- | --- | --- |
| EP | 2 883 900 | 6/2015 |
| JP | 56-4654 | 1/1981 |
| JP | 56-135549 | 10/1981 |
| JP | 06-116495 | 4/1994 |
| JP | 06-220322 | 8/1994 |
| JP | 08-269199 | 10/1996 |
| JP | 11-335653 | 12/1999 |
| JP | 2001-151900 | 6/2001 |
| JP | 2006-342970 | 12/2006 |
| JP | 2012-513492 | 6/2012 |
| JP | 2013-518933 | 5/2013 |
| JP | 2013-117014 | 6/2013 |
| JP | 2013-522386 | 6/2013 |
| WO | 2012-108446 | 8/2012 |

OTHER PUBLICATIONS

International Search Report dated Apr. 21, 2015 in International Application No. PCT/JP2015/053023.
International Preliminary Report on Patentability and Written Opinion of the International Searching Authority dated Aug. 18, 2016 in International (PCT) Application No. PCT/JP2015/053023.
European Search Report dated Dec. 16, 2016 in corresponding European Application No. 15746069.2.
Office Action dated Nov. 14, 2017 in Chinese Application No. 201580007035.0, with partial English translation.

*Primary Examiner* — Peter F Godenschwager
(74) *Attorney, Agent, or Firm* — Wenderoth, Lind & Ponack, L.L.P.

(57) ABSTRACT

A polyarylene sulfide resin composition which is excellent in mechanical strength as well as electromagnetic shielding effect, slidability and moist heat resistance.
The resin composition comprises (A) 100 parts by weight of a polyarylene sulfide resin (component A) synthesized through a polymerization reaction using an aromatic disulfide-based compound as a polymerization terminator and (B) 10 to 180 parts by weight of carbon fibers (component B), wholly aromatic polyamide fibers (component C) or glass fibers (component D).

9 Claims, No Drawings

POLYARYLENE SULFIDE RESIN COMPOSITION

TECHNICAL FIELD

The present invention relates to a resin composition which comprises a polyarylene sulfide resin and is excellent in mechanical strength as well as electromagnetic shielding effect, slidability and moist heat resistance.

BACKGROUND ART

Polyarylene sulfide resin is an engineering plastic having excellent chemical resistance, heat resistance and mechanical properties. Therefore, the polyarylene sulfide resin is widely used in electric and electronic parts, vehicle-related parts, aircraft parts and housing equipment parts. As electronic equipment products such as digital cameras and tablets are becoming smaller in size, product housings in use are becoming thinner. Further, in the field of vehicle-related parts such as auto parts, vehicles are becoming lighter in weight for energy saving.

To reduce the thicknesses and weights of products for these applications, studies on shift from metal materials to resin materials are under way.

For resin materials which will become substitutes for metal materials, strength, heat resistance and chemical resistance are required. In addition, an electromagnetic shielding effect capable of suppressing the malfunction of peripheral equipment caused by electromagnetic waves produced during communication with a portable terminal or during the driving of an automobile and also the influence upon human bodies of the electromagnetic waves are required.

Although the polyarylene sulfide resin has excellent heat resistance and chemical resistance, it is insulating and therefore has low conductivity and unsatisfactory mechanical strength. To solve this problem, Patent Document 1 proposes a resin composition comprising a polyarylene sulfide resin and carbon fibers. However, this resin composition is unsatisfactory as it does not meet the requirements for both mechanical strength and electromagnetic shielding effect.

For resin materials which will become substitutes for metal materials for use in the bearings of gears, slidability and impact strength are required. Although the polyarylene sulfide resin has higher slidability than other resins, it is unsatisfactory in terms of slidability and impact strength when it is used for these applications. To solve this problem, Patent Document 2 proposes a resin composition comprising a polyarylene sulfide resin and wholly aromatic polyamide fibers. However, this resin composition is unsatisfactory as it does not meet the requirements for both slidability and impact strength. Patent Document 3 proposes a resin composition comprising a polyphenylene sulfide resin, wholly aromatic polyamide fibers and stainless flakes. Since this resin composition comprises a filler except for the wholly aromatic polyamide fibers, it does not meet the requirement for impact strength.

Patent Document 4 proposes a resin composition comprising a polyarylene sulfide resin and glass fibers. However, the resin composition of this document is unsatisfactory as it does not meet the requirements for both mechanical strength and moist heat resistance.

Meanwhile, Patent Documents 5 and 6 disclose a process for producing polyarylene sulfide by reacting a diiodo aromatic compound, a sulfur compound and a polymerization terminator. Patent Document 5 discloses diphenyl disulfide as a polymerization terminator. Patent Document 6 discloses diphenyl sulfide as a polymerization terminator.

(Patent Document 1) JP-A 56-135549
(Patent Document 2) JP-A 56-4654
(Patent Document 3) JP-A 06-116495
(Patent Document 4) JP-A 06-220322
(Patent Document 5) JP-A 2012-513492
(Patent Document 6) JP-A 2013-518933

DISCLOSURE OF THE INVENTION

It is an object of the present invention to provide a polyarylene sulfide resin composition which is excellent in electromagnetic shielding effect, slidability or moist heat resistance.

The inventors of the present invention found that a resin composition comprising a polyarylene sulfide resin (component A) synthesized through a polymerization reaction using an aromatic disulfide-based compound as a polymerization terminator and carbon fibers (component B) is excellent in mechanical strength and electromagnetic shielding effect.

They also found that a resin composition comprising a polyarylene sulfide resin (component A) synthesized through a polymerization reaction using an aromatic disulfide-based compound as a polymerization terminator and wholly aromatic polyamide fibers (component C) is excellent in mechanical strength and slidability.

They further found that a resin composition comprising a polyarylene sulfide resin (component A) synthesized through a polymerization reaction using an aromatic disulfide-based compound as a polymerization terminator and glass fibers (component D) is excellent in mechanical strength and moist heat resistance.

That is, the object of the present invention is attained by a resin composition comprising (A) 100 parts by weight of a polyarylene sulfide resin (component A) synthesized through a polymerization reaction using an aromatic disulfide-based compound as a polymerization terminator and (B) 10 to 180 parts by weight of carbon fibers (component B), wholly aromatic polyamide fibers (component C) or glass fibers (component D).

BEST MODE FOR CARRYING OUT THE INVENTION

The present invention will be described in detail hereinunder.

<Polyarylene Sulfide Resin (Component A)>

The polyarylene sulfide resin (component A) is synthesized through a polymerization reaction using an aromatic disulfide-based compound as a polymerization terminator.

The polyarylene sulfide resin (component A) contains as a constituent unit, for example, a p-phenylene sulfide unit, m-phenylene sulfide unit, o-phenylene sulfide unit, phenylene sulfide sulfone unit, phenylene sulfide ketone unit, phenylene sulfide ether unit, diphenylene sulfide unit, phenylene sulfide unit containing a substituent or phenylene sulfide unit containing a branched structure. The polyarylene sulfide resin contains preferably not less than 70 mol %, particularly preferably not less than 90 mol % of the p-phenylene sulfide unit. The polyarylene sulfide resin is much more preferably poly(p-phenylene sulfide).

The polyarylene sulfide resin (component A) is synthesized through a polymerization reaction using an aromatic disulfide-based compound as a polymerization terminator. When the polyarylene sulfide resin synthesized by this method is used, affinity for carbon fibers lowers, whereby the residual fiber length of the carbon fibers contained in the resin is made large at the time of melt kneading, thereby making it possible to improve mechanical strength and electromagnetic shielding effect.

When the polyarylene sulfide resin synthesized by this method is used, affinity for wholly aromatic polyamide fibers lowers, whereby the residual fiber length of the wholly aromatic polyamide fibers contained in the resin is made large at the time of melt kneading, thereby making it possible to improve slidability and impact strength.

When the polyarylene sulfide resin synthesized by the above method is used, affinity for glass fibers lowers, whereby the residual fiber length of the glass fibers contained in the resin is made large at the time of melt kneading, thereby making it possible to improve moist heat resistance and impact strength.

The process for producing the polyarylene sulfide resin (component A) is not particularly limited as long as the aromatic disulfide-based compound is used as a polymerization terminator, and the polyarylene sulfide resin is polymerized by a known process.

The production process is preferably a process in which a diiodoaryl compound, solid sulfur and an aromatic disulfide-based compound are directly heated and polymerized without using a polar solvent.

The production process comprises an iodizing step and a polymerization step. In the iodizing step, an aryl compound is reacted with iodine to obtain a diiodoaryl compound. In the subsequent polymerization step, a polymerization reaction between the diiodoaryl compound and solid sulfur is carried out by using a polymerization terminator to produce a polyarylene sulfide resin. Iodine is produced as a gaseous material in this step and collected to be re-used in the iodizing step. Iodine is substantially a catalyst.

Typical solid sulfur is cyclooctasulfur ($S_8$) in which eight atoms are interlinked at room temperature. However, the sulfur compound used in the polymerization reaction is not limited, and any sulfur compound may be used as long as it is solid or liquid at room temperature.

A typical example of the diiodoaryl compound is at least one selected from the group consisting of diiodobenzene, diiodonaphthalene, diiodobiphenyl, diiodobisphenol and diiodobenzophenone. Iodoaryl compound derivatives having an alkyl group or sulfone group bonded thereto or into which oxygen or nitrogen has been introduced may also be used. Iodoaryl compounds are classified into different isomers according to the bonding position of an iodine atom, and preferred examples of the isomers include compounds in which iodine atoms are existent symmetrically at both ends of the molecule of an aryl compound, such as p-diiodobenzene, 2,6-diiodonaphthalene and p,p'-diiodobiphenyl. The content of the iodoaryl compound is preferably 500 to 10,000 parts by weight based on 100 parts by weight of the solid sulfur. This amount is determined in consideration of the production of a disulfide bond.

The polymerization terminator is an aromatic disulfide compound. When no aromatic disulfide compound is used as a polymerization terminator, affinity between the carbon fibers and the resin improves, whereby the residual fiber length of the carbon fibers contained in the resin becomes small at the time of melt kneading, thereby deteriorating mechanical strength and electromagnetic shielding effect.

When no aromatic disulfide compound is used as a polymerization terminator, affinity for the wholly aromatic polyamide fibers improves, whereby the residual fiber length of the wholly aromatic polyamide fibers contained in the resin becomes small at the time of melt kneading, thereby deteriorating slidability and impact strength.

When no aromatic disulfide compound is used as a polymerization terminator, affinity for the glass fibers improves, whereby the residual fiber length of the glass fibers contained in the resin becomes small at the time of melt kneading, thereby deteriorating moist heat resistance and impact strength.

The aromatic disulfide compound is preferably at least one selected from the group consisting of benzothiazoles and diphenyl disulfides. It is more preferably at least one selected from the group consisting of diphenyl disulfide and dithiobisbenzothiazole. It is much more preferably 2,2'-dithiobisbenzothiazole, dibenzothiazole disulfide or diphenyl disulfide. In these polymerization terminators, a functional group between phenyls serves as an electron donor so that higher polymerization reactivity is developed. The content of the polymerization terminator is preferably 0.005 to 35 parts by weight, more preferably 0.01 to 30 parts by weight, much more preferably 0.03 to 25 parts by weight based on 100 parts by weight of the solid sulfur in order to achieve the effect of improving thermal properties and brightness with minimum cost.

In the production process, a polymerization reaction catalyst may be optionally used in the polymerization step. Typical examples of the polymerization reaction catalyst include nitrobenzene derivatives. Among these polymerization reaction catalysts, at least one selected from the group consisting of 3-diiodo-4-nitrobenzene, 1-iodo-4-nitrobenzene, 2,6-diiodo-4-nitrophenol and iodonitrobenzene is preferably used. The content of the polymerization reaction catalyst is preferably 0.01 to 20 parts by weight based on 100 parts by weight of the above solid sulfur from the viewpoints of the degree of improving polymerization, economic efficiency and preventing the color of the polyarylene sulfide resin from becoming dark.

It is preferred that the reaction should proceed by elevating the temperature from a range of 180 to 250° C. at the beginning to a range of 270 to 350° C. in the end and reducing the pressure from a range of 50 to 450 Torr (6.7 to 60 kPa) at the beginning to a range of 0.001 to 20 Torr (0.00013 to 2.7 kPa) in the end for 1 to 30 hours. The initial reaction is preferably carried out at a temperature of 180° C. or higher and a pressure of 450 Torr (60 kPa) or lower in consideration of a reaction rate, and the final reaction is preferably carried out at a temperature of 350° C. or lower and a pressure of 20 Torr (2.7 kPa) or lower in consideration of the thermal decomposition of a polymer.

Since the polymerization reaction conditions depend on the structural design of a reactor and production speed and are known among people having ordinary skill in the art, they are not particularly limited. The reaction conditions may be suitably set by people having ordinary skill in the art in consideration of process conditions.

<Carbon Fibers (Component B)>

Examples of the carbon fibers (component B) include carbon fibers, carbon milled fibers and carbon nanotubes. The carbon nanotubes may have a single layer, double layers or multiple layers but preferably have multiple layers (that is, MWCNT) and a fiber diameter of 0.003 to 0.1 μm. Out of these, carbon fibers are preferred and metal-coated carbon fibers are more preferred as they have high mechanical strength and can provide high conductivity. High conductivity is one of important properties required for resin materials in the digital precision equipment (typified by digital still cameras) of recent years.

Cellulose-based, polyacrylonitrile-based and pitch-based carbon fibers may be used. Carbon fibers obtained by a spinning method without an infusibilizing step typified by a method in which a raw material composition comprising an aromatic sulfonic acid or a polymer prepared by the methylene type bonding of a salt thereof and a solvent is spun or molded and carbonized may also be used. Further, general-purpose carbon fibers, intermediate elastic modulus carbon fibers and high elastic modulus carbon fibers may be used. Out of these, high elastic modulus carbon fibers such as polyacrylonitrile-based carbon fibers are particularly preferred.

The average fiber diameter of the carbon fibers is not particularly limited but preferably 3 to 15 μm, more preferably 5 to 13 μm. Carbon fibers having an average fiber diameter within the above range can develop excellent mechanical strength and fatigue characteristics without impairing the appearance of a molded article.

The preferred fiber length of the carbon fibers is 60 to 500 μm, more preferably 80 to 400 particularly preferably 100 to 300 μm in terms of number average fiber length in the resin composition. The number average fiber length is a value calculated by an image analyzer from the optical microscope observation of the carbon fiber residue obtained by treatments such as the high-temperature ashing of a molded article, dissolution with a solvent and decomposition with a chemical. This value is calculated without counting fibers having a smaller diameter than the above fiber length.

The metal-coated carbon fibers have a metal layer coated on the surfaces of carbon fibers. Examples of the metal include silver, copper, nickel and aluminum out of which nickel is preferred from the viewpoint of the corrosion resistance of the metal layer. To coat a metal, various methods may be employed. Plating is preferably used out of these methods. In the case of the metal-coated carbon fibers, the carbon fibers listed above may be used as the carbon fibers. The thickness of the metal coating layer is preferably 0.1 to 1 μm, more preferably 0.15 to 0.5 μm. It is much more preferably 0.2 to 0.35 μm. Metal uncoated carbon fibers and metal-coated carbon fibers are preferably sized with an olefin-based resin, styrene-based resin, acrylic resin, polyester-based resin, epoxy-based resin or urethane-based resin. Fibrous carbon fillers treated with a urethane-based resin and an epoxy-based resin are preferred in the present invention because they have excellent mechanical strength.

The content of the carbon fibers (component B) is 10 to 180 parts by weight, preferably 15 to 180 parts by weight, more preferably 18 to 150 parts by weight, much more preferably 20 to 140 parts by weight based on 100 parts by weight of the component A. When the content of the component B is lower than 10 parts by weight, stiffness, strength and electromagnetic shielding effect do not improve fully and when the content is higher than 180 parts by weight, strand breakage or surging occurs at the time of melt extrusion with the result of reduced productivity.

<Wholly Aromatic Polyamide Fibers (Component C)>

Any wholly aromatic polyamide fibers (component C) may be used if they belong to a category called "aramid fibers". Examples of the aramid fibers include meta-aramid fibers and para-aramid fibers.

A wholly aromatic aramid resin which is the raw material of the wholly aromatic polyamide fibers (component C) is substantially obtained from at least one aromatic diamine and at least one aromatic dicarboxylic acid halide. A condensation agent typified by triphenyl phosphide and pyridine may be added to at least one aromatic diamine and at least one aromatic dicarboxylic acid. Both para-aramid and meta-aramid may be used but para-aramid is preferred.

Preferred examples of the aromatic diamine include p-phenylenediamine, benzidine, 4,4"-diamino-p-terphenyl, 2,7-diaminofluorene, 3,4-diaminodiphenyl ether, 4,4'-diaminodiphenyl ether, 1,4-bis-(4-aminophenoxy)benzene, 4,4'-bis-(4-aminophenoxy)biphenyl and 9,10-bis-(4-aminophenyl)anthracene.

The aromatic dicarboxylic acid halide is particularly preferably an aromatic dicarboxylic acid chloride exemplified by terephthalic acid chloride, 2,6-naphthalenedicarboxylic acid chloride, 4,4'-diphenyldicarboxylic acid chloride and aromatic dicarboxylic acid chlorides having at least one nonreactive functional group such as lower alkyl group, lower alkoxy group, halogeno group or nitro group in the aromatic ring. Further, when an aromatic dicarboxylic acid is used, terephthalic acid, 2,6-naphthalenedicarboxylic acid, 4,4'-diphenyldicarboxylic acid and dicarboxylic acids having at least one nonreactive functional group such as lower alkyl group, lower alkoxy group, halogeno group or nitro group in the aromatic ring may be used. Further, the structure of preferred aramid in the present invention has a main skeleton represented by the following formula.

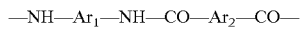

($Ar_1$ and $Ar_2$ are each at least one aromatic residue selected from the group consisting of the following general formulas [I] to [IV]. $Ar_1$ and $Ar_2$ may be the same or different. Some of the hydrogen atoms of these aromatic residues may be substituted by a halogen atom or lower alkyl group.)

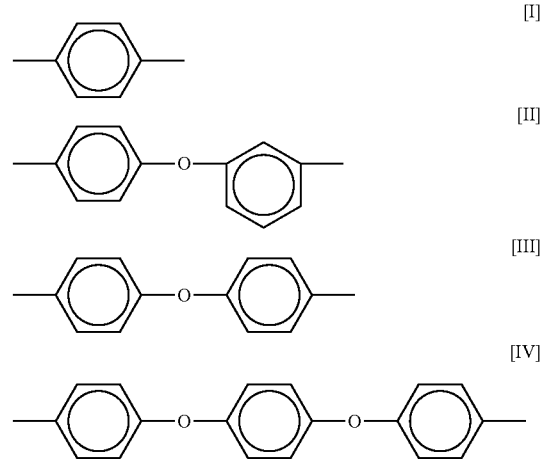

Preferably, the total amount of the general formulas [I] and [II], the total amount of the general formulas [I] and [III], the total amount of the general formulas [I] and [IV] or the amount of the general formula [I] is not less than 80 mol % based on 100 mol % of the total of $Ar_1$ and $Ar_2$. More preferably, the total amount of the general formulas [I] and [II] or the total amount of the general formulas [I] and [III] is not less than 80 mol %. Much more preferably, the total amount of the general formulas [I] and [II] or the total amount of the general formulas [I] and [III] is not less than 80 mol %, and the amount of the general formula [II] or [III] is 1 to 20 mol %.

Aramid dope which is spinning dope may be obtained by solution polymerization or by dissolving a separately obtained wholly aromatic aramid resin in a solvent but preferably obtained by solution polymerization. A small amount of an inorganic salt may be added as a dissolution aid to improve solubility. Examples of the inorganic salt include lithium chloride and calcium chloride.

A known aprotic organic polar solvent is generally used as a polymerization solvent or re-dissolving solvent. Examples thereof include N-methyl-2-pyrrolidone, N-ethyl-2-pyrrolidone, N,N-dimethylformamide, N,N-dimethyl acetamide, N,N-diethyl acetamide, N,N-dimethylpropionamide, N,N-butylamide, N,N-dimethyl isobutylamide, N-methyl caprolactam, N,N-dimethyl methoxyacetamide, N-acetylpyrrolidine, N-acetylpiperidine, N-methyl piperidone-2,N,N'-dimethylethylene urea, N,N'-dimethylpropylene urea, N,N, N',N'-tetramethylmalonamide, N-acetylpyrrolidone, N,N,N', N'-tetramethyl urea and dimethyl sulfoxide. Strong acids such as concentrated sulfuric acid and methanesulfonic acid may be used as the re-dissolving solvent.

The polymerization degree of the wholly aromatic aramid resin is not particularly limited but preferably high when the wholly aromatic aramid resin is dissolved in a solvent. For the solution polymerization of the wholly aromatic aramid resin, a reaction is carried out substantially in an equal molar ratio of an acid component and a diamine component. However, for the control of the degree of polymerization, any one of the components may be used excessively. A monofunctional acid component or amine component may be used as a terminal capping agent.

To mold a wholly aromatic aramid resin into a fibrous form, a method in which aramid dope is wet molded is generally employed, and there are a method in which the dope is directly ejected into a coagulation bath and a method in which an air gap is formed to eject the dope into a coagulation bath. A poor solvent for the wholly aromatic aramid resin is used as the coagulation bath. To prevent a defect formed in the wholly aromatic aramid fibers by the quick removal of the solvent for the aramid dope, a good solvent is generally added to control the coagulation speed. Preferably, water is used as a poor solvent and a solvent for the aramid dope is used as a good solvent. The ratio of the good solvent to the poor solvent which depends on the solubility or coagulation properties of the wholly aromatic aramid resin is preferably 15/85 to 40/60.

The fiber length of the wholly aromatic aramid fibers is preferably 0.1 to 6 mm, more preferably 0.5 to 3 mm. When it is less than 1 mm, a reinforcing effect becomes unsatisfactory and the improvement of impact resistance may become unsatisfactory. When it is more than 6 mm, it may be difficult to handle the wholly aromatic aramid fibers at the time of production and the flowability and moldability of the composition may deteriorate.

The wholly aromatic aramid fibers are effective regardless of the existence or non-existence of sizing, and the sized wholly aromatic aramid fibers are easy to handle advantageously. Polyester, polyurethane and polyether sulfone resins may be used as a binder for sizing, and an aromatic polyester is particularly preferred. The above heat-resistant organic fibers may be used alone or in combination of two or more in the present invention.

The content of the wholly aromatic polyamide fibers (component C) is 10 to 180 parts by weight, preferably 10 to 150 parts by weight, more preferably 15 to 120 parts by weight, much more preferably 20 to 100 parts by weight based on 100 parts by weight of the component A. When the content of the component C is lower than 10 parts by weight, slidability and impact strength do not improve fully and when the content is higher than 180 parts by weight, strand breakage or surging occurs at the time of melt extrusion with the result of reduced productivity.

<Glass Fibers (Component D)>

The glass fibers (component D) are not limited to specific glass composition such as A glass, C glass, E glass (alkali-free glass) and may contain a component such as $TiO_2$, $SO_3$ or $P_2O_5$. It is preferred that E glass should be blended into the polyarylene sulfide resin. The glass fibers (component D) are formed into a predetermined fibrous form by quenching molten glass while they are stretched by various methods. Quenching and stretching conditions in this case are not particularly limited. The cross section of each of the fibers may have an elliptic, cocoon-like or three-leafed shape besides a spherical shape. A mixture of spherical glass fibers and glass fibers having another shape may be used. These glass fibers are known to people having ordinary skill in the art and can be acquired from a large number of manufacturers.

The content of the glass fibers (component D) is 10 to 180 parts by weight, preferably 15 to 180 parts by weight, more preferably 18 to 150 parts by weight, much more preferably 20 to 140 parts by weight based on 100 parts by weight of the component A. When the content of the glass fibers (component D) is lower than 10 parts by weight, stiffness and strength do not improve fully and when the content is higher than 180 parts by weight, strand breakage or surging occurs at the time of melt extrusion with the result of reduced productivity and reduced strength.

<Other Additives>

The resin composition of the present invention may comprise an elastomer component as long as the effect of the present invention is not impaired. Preferred examples of the elastomer component include core-shell graft copolymer resins such as acrylonitrile•butadiene•styrene-based copolymer (ABS resin), methyl methacrylate•butadiene•styrene copolymer (MBS resin) and silicone•acrylic composite rubber-based graft copolymer, and thermoplastic elastomers such as silicone-based thermoplastic elastomers, olefin-based thermoplastic elastomers, polyamide-based thermoplastic elastomers, polyester-based thermoplastic elastomers and polyurethane-based thermoplastic elastomers.

The resin composition of the present invention may comprise another thermoplastic resin as long as the effect of the present invention is not impaired. Examples of the thermoplastic resin include general-purpose plastics typified by polyethylene resin, polypropylene resin and polyalkyl methacrylate resin, engineering plastics typified by polyphenylene ether resin, polyacetal resin, aromatic polyester resin, liquid crystalline polyester resin, polyamide resin, cyclic polyolefin resin and polyarylate resin (amorphous polyarylate, liquid crystalline polyarylate), and so-called "super-engineering plastics" such as polytetrafluoroethylene, polyether ether ketone, polyether imide, polysulfone and polyether sulfone.

An antioxidant and heat stabilizer (such as hindered phenol-based, hydroquinone-based or phosphite-based heat stabilizer, or substituent thereof), weathering agent (such as resorcinol-based, salicylate-based, benzotriazole-based, benzophenone-based or hindered amine-based weathering agent), release agent and lubricant (such as montanic acid or a metal salt, ester or half ester thereof, stearyl alcohol, stearamide, bisamide, bisurea or polyethylene wax), pigment (such as calcium sulfide, phthalocyanine or carbon black), dye (such as nigrosine), crystal nucleating agent (such as talc, silica, kaolin or clay), plasticizer (such as octyl p-oxybenzoate or N-butylbenzenesulfonamide), antistatic agent (such as an alkyl sulfate type anionic antistatic agent, quaternary ammonium salt type cationic antistatic agent, nonionic antistatic agent exemplified by polyoxyethylene sorbitan monostearate or betain-based amphoteric antistatic agent), flame retardant (such as red phosphor, phosphate, melamine cyanurate, hydroxide exemplified by magnesium hydroxide and aluminum hydroxide, ammonium polyphosphate, brominated polystyrene, brominated polyphenylene ether, brominated polycarbonate, brominated epoxy resin or a combination of a bromine-based flame retardant and antimony trioxide), and another polymer may be added to the resin composition of the present invention as long as the effect of the present invention is not impaired.

The resin composition of the present invention may comprise a filler except for the carbon fibers (component B), the wholly aromatic polyamide fibers (component C) and the glass fibers (component ID) as long as the effect of the present invention is not impaired. Although the material thereof is not particularly limited, a fibrous, lamellar, powdery or particulate filler may be used. Examples of the filler include fibrous fillers such as potassium titanate whiskers, zinc oxide whiskers, alumina fibers, silicon carbide fibers, ceramic fibers, asbestos fibers, calcium sulfate fibers and metal fibers, silicates such as wollastonite, sericite, kaolin, mica, clay, bentonite, asbestos, talc and alumina silicate, expandable lamellar silicates such as montmorillonite and synthetic mica, metal compounds such as alumina, silicon oxide, magnesium oxide, zirconium oxide, titanium oxide and iron oxide, carbonates such as calcium carbonate, magnesium carbonate and dolomite, sulfates such as calcium sulfate and barium sulfate, and nonfibrous fillers such as glass beads, ceramic beads, boron nitride, silicon carbide, calcium phosphate and silica. They may be hollow and further may be used in combination of two or more.

These fillers are preferably pre-treated with a coupling agent such as isocyanate-based compound, organic silane-based compound, organic titanate-based compound, organic borane-based compound or epoxy compound and the expandable lamellar silicates are preferably pre-treated with an organizing onion ion before use to obtain excellent mechanical strength.

The resin composition of the present invention may comprise a conductive filler except for the carbon fibers (component B) as a filler for providing higher conductivity. The material thereof is not particularly limited, and any conductive filler which is generally used to make a resin conductive may be used, as exemplified by metal powders, metal flakes, metal ribbons, metal fibers, metal oxides, inorganic fillers coated with a conductive material, carbon powders, graphite, carbon flakes and scale-like carbon.

Examples of the metal of the metal powders, metal flakes and metal ribbons include silver, nickel, copper, zinc, aluminum, stainless, iron, brass, chromium and tin. Examples of the metal of the metal fibers include iron, copper, stainless, aluminum and brass. The metal powders, metal flakes, metal ribbons and metal fibers may be surface-treated with a surface treating agent such as titanate-based, aluminum-based or silane-based surface treating agent.

The metal oxides include $SnO_2$ (antimony dope), $In_2O_3$ (antimony dope) and ZnO (aluminum dope) all of which may be surface-treated with a surface treating agent such as titanate-based, aluminum-based or silane-based coupling agent.

Examples of the conductive material in the inorganic fillers coated with a conductive material include aluminum, nickel, silver, carbon, $SnO_2$ (antimony dope) and $In_2O_3$ (antimony dope). The inorganic fillers to be coated include mica, glass beads, glass fibers, potassium titanate whiskers, barium sulfate, zinc oxide, titanium oxide, aluminum borate whiskers, zinc oxide-based whiskers, titanic acid-based whiskers and silicon carbide whiskers. As means for coating the inorganic fillers, vacuum deposition, sputtering, electroless plating and baking methods may be used. These inorganic fillers may be surface-treated with a surface treating agent such as titanate-based, aluminum-based or silane-based coupling agent.

The carbon powders are classified into acetylene black, gas black, oil black, naphthalene black, thermal black, furnace black, lamp black, channel black, roll black and disk black according to the raw material and production process. Although the raw material and production process of the carbon powders which may be used in the present invention are not particularly limited, acetylene black and furnace black are particularly preferably used.

<Production of Resin Composition>

The resin composition of the present invention can be produced by mixing together the above components by means of a mixer such as tumbler, twin-cylinder mixer, Nauter mixer, Banbury mixer, kneading roll or extruder simultaneously or in an arbitrary order. The components are preferably melt kneaded together by means of a twin-screw extruder, and optional components are preferably supplied into other components which have been melt mixed together from a second feed port by using a side feeder as required. An extruder having a vent from which water contained in the raw material and a volatile gas generated from the molten kneaded resin can be removed may be preferably used. A vacuum pump is preferably installed to discharge the generated water and volatile gas from the vent to the outside of the extruder efficiently. A screen for removing foreign matter contained in the extruded raw material may be installed in a zone before the die of the extruder to remove the foreign matter from the resin composition. Examples of the screen include a metal net, screen changer and sintered metal plate (such as a disk filter).

The screw used in the twin-screw extruder is constituted such that screw pieces having various shapes are inserted between forward flight pieces for transport and intricately combined into a single integrated screw, for example, a combination of screw pieces such as forward flight piece, forward kneading piece, back kneading piece and back flight piece which are arranged at suitable positions in a suitable order in consideration of the characteristic properties of a raw material to be treated. One back feed screw element having a flight part with an arc-shaped cutout as shown in FIG. 2 of JP-A 2012-213997 is preferred. Examples of the melt kneader include a Banbury mixer, a kneading roll, a single-screw extruder and a multi-screw extruder having 3 or more screws, besides the twin-screw extruder.

The resin extruded as described above is pelletized by directly cutting it or by forming it into a strand and cutting the strand with a pelletizer. When the influence of extraneous dust must be reduced at the time of pelletization, the atmosphere surrounding the extruder is preferably made clean. The shape of the obtained pellet may be columnar, rectangular column-like, spherical or other ordinary shape but preferably columnar. The diameter of the column is preferably 1 to 5 mm, more preferably 1.5 to 4 mm, much more preferably 2 to 3.5 mm. The length of the column is preferably 1 to 30 mm, more preferably 2 to 5 mm, much more preferably 2.5 to 4 mm.

<Molded Article>

A molded article of the resin composition of the present invention can be obtained by molding the pellet produced as described above. It is preferably obtained by injection molding or extrusion molding. For injection molding, not only ordinary molding techniques but also injection compression molding, injection press molding, gas assist injection molding, foam molding (including what comprises the injection of a super-critical fluid), insert molding, in-mold coating molding, insulated runner molding, quick heating and cooling molding, two-color molding, multi-color molding, sandwich molding and super high-speed injection molding techniques may be used. For molding, either one of cold-runner molding molding and hot-runner molding techniques may be selected. A profile extrusion molded article, a sheet or a film is obtained by extrusion molding. To mold a sheet or a film, inflation, calendering and casting techniques may also be used. Further, specific drawing operation may be used to mold a heat shrinkable tube. The resin composition of the present invention can be formed into a molded article by rotational molding or blow molding as well.

The mode of the present invention which the inventors of the present invention think is the best at present is the integration of the preferred ranges of the above requirements, and typical examples thereof are described in the following examples. As a matter of course, the present invention is not limited to these modes.

EXAMPLES

Examples 1 to 12, Comparative Examples 1 to 3

Amounts shown in Table 1 of a polyarylene sulfide resin and carbon fibers were melt kneaded together by using a vented twin-screw extruder to obtain a pellet. The TEX-30XSST of The Nippon Steel Works, Ltd. (completely interlocking type, unidirectional rotation) was used as the vented twin-screw extruder. As for extrusion conditions, the delivery rate was 12 kg/h, the screw revolution was 150 rpm, the vacuum degree of the vent was 3 kPa, and the extrusion temperature from the first feed port to the die was 320° C. The carbon fibers were supplied from the second feed port by using the side feeder of the extruder, and the polyarylene sulfide resin was supplied into the extruder from the first feed port. The first feed port is a feed port farthest from the die, and the second feed port is situated between the die of the extruder and the first feed port. The obtained pellet was dried at 130° C. for 6 hours by means of a hot air circulation drier and formed into a test piece for evaluation by means of an injection molding machine. The evaluation results are shown in Table 1.

The TEX-30XSST of The Nippon Steel Works, Ltd. is a vented twin-screw extruder having one back feed screw element with a flight part having an arc-shaped cutout as shown in FIG. 2 of JP-A 2012-213997.

<Evaluation>

The resin composition was evaluated as follows.

(1) Flexural Strength

This was measured in accordance with ISO178 (measurement condition of 23° C.). A test piece was formed at a cylinder temperature of 320° C. and a mold temperature of 130° C. by means of an injection molding machine (SG-150U of Sumitomo Heavy Industries, Ltd.). As this numerical value becomes larger, the mechanical strength of the resin composition becomes higher.

(2) Electromagnetic Shielding Effect

A test piece (size: 150 mm in length×150 mm in width× 1.5 mm in thickness) formed under the same conditions as in (1) was put in an atmosphere having a temperature of 23° C. and a relative humidity of 50% RH to measure a field wave (frequency of 800 MHz) by using the TR-17301A and R3361A of Advantest Corporation. As this numerical value becomes larger, the resin composition becomes more excellent in electromagnetic shielding effect.

<Components>

The components represented by symbols in Table 1 are as follows.

(Component A)

PPS-1: Polyphenylene Sulfide Resin Obtained by the Following Production Process

A mixture of 300.0 g of p-diiodobenzene, 29.15 g of solid sulfur and 0.75 g of diphenyl disulfide as a polymerization terminator was heated at 180° C. to be melt mixed together. The polymerization reaction of the molten mixture was carried out at a temperature of 220° C. and a pressure of 350 Torr (46.7 kPa) for 1 hour; at a temperature of 230° C. and a pressure of 200 Torr (26.7 kPa) for 2 hours; at a temperature of 250° C. and a pressure of 120 Torr (16.0 kPa) for 1 hour; by reducing the pressure to 60 Torr (8.0 kPa) for 1 hour; by raising the temperature to 280° C. for 1 hour; by reducing the pressure to 10 Torr (1.3 kPa) for 1 hour; and at a temperature of 300° C. and a pressure of 1 Torr (0.13 kPa) or less for 1 hour, totaling 8 hours, to produce a polyphenylene sulfide resin.

PPS-2: Polyphenylene Sulfide Resin Obtained by the Following Production Process

This polyphenylene sulfide resin was produced in the same manner as PPS-1 except that 0.88 g of 2,2-dithiobisbenzothiazole was used in place of diphenyl disulfide as a polymerization terminator.

PPS-3: Polyphenylene Sulfide Resin Obtained by the Following Production Process

This polyphenylene sulfide resin was produced in the same manner as PPS-1 except that 1.88 g of dicarboxylic acid diphenyl disulfide was used in place of diphenyl disulfide as a polymerization terminator.

PPS-4 (Comparative): Polyphenylene Sulfide Resin Obtained by the Following Production Process This polyphenylene sulfide resin was produced in the same manner as PPS-1 except that 0.96 g of zinc diethyldiocarbamate was used in place of diphenyl disulfide as a polymerization terminator.

PPS-5 (Comparative): PPS MA-505 of DIC Corporation (Polyphenylene Sulfide Resin Produced without Using an Aromatic Disulfide-Based Compound as a Polymerization Terminator)

(Component B)

B-1: carbon fiber (manufactured by Toho Tenax Co., Ltd., HT C432 6 mm, long diameter of 7 μm, cut length of 6 mm, urethane-based sizing agent)

B-2: carbon fiber (manufactured by Toho Tenax Co., Ltd., HT C205 6 mm, long diameter of 7 μm, cut length of 6 mm, epoxy-based sizing agent)

B-3: carbon fiber (manufactured by Toho Tenax Co., Ltd., HT C603 6 mm, long diameter of 7 μm, cut length of 6 mm, nylon-based sizing agent)

B-4: nickel-coated carbon fiber (manufactured by Toho Tenax Co., Ltd., HT C903 6 mm, long diameter of 7 μm, cut length of 6 mm, epoxy•urethane-based sizing agent)

TABLE 1

| | | Unit | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Component A | PPS-1 | parts by weight | 100 | 100 | 100 | 100 | 100 | 100 | 100 | 100 |
| | PPS-2 | | | | | | | | | |
| | PPS-3 | | | | | | | | | |
| | PPS-4 | | | | | | | | | |
| | PPS-5 | | | | | | | | | |
| Component B | B-1 | parts by weight | 25 | 45 | 65 | 150 | | | | |
| | B-2 | | | | | | 45 | | | |
| | B-3 | | | | | | | 45 | | |
| | B-4 | | | | | | | | 15 | 25 |
| Flexural strength | | MPa | 289 | 355 | 320 | 315 | 234 | 274 | 165 | 183 |
| Electromagnetic shielding effect | | dB | 26 | 30 | 34 | 36 | 35 | 33 | 45 | 53 |
| | | Unit | Ex. 9 | Ex. 10 | Ex. 11 | Ex. 12 | C. Ex. 1 | C. Ex. 2 | C. Ex. 3 | C. Ex. 4 | C. Ex. 5 |
| Component A | PPS-1 | parts by weight | | | 100 | 100 | 100 | 100 | | | |
| | PPS-2 | | 100 | | | | | | | | |
| | PPS-3 | | | 100 | | | | | | | |
| | PPS-4 | | | | | | | | 100 | | |
| | PPS-5 | | | | | | | | | 100 | 100 |
| Component B | B-1 | parts by weight | | | | | 12 | 200 | 25 | | |
| | B-2 | | | | | | | | | 45 | |
| | B-3 | | | | | | | | | | |
| | B-4 | | 25 | 25 | 35 | 45 | | | | | 25 |
| Flexural strength | | MPa | 184 | 185 | 178 | 190 | 145 | Not extrudable | 159 | 215 | 140 |
| Electromagnetic shielding effect | | dB | 52 | 48 | 50 | 58 | 18 | | 19 | 23 | 35 |

Ex.: Example,
C. Ex.: Comparative Example

Examples 13 to 24, Comparative Examples 6 to 9

Amounts shown in Table 2 of a polyarylene sulfide resin and wholly aromatic polyamide fibers were melt kneaded together by using a vented twin-screw extruder to obtain a pellet. The TEX-30XSST of The Nippon Steel Works, Ltd. (completely interlocking type, unidirectional rotation) was used as the vented twin-screw extruder. As for extrusion conditions, the delivery rate was 12 kg/h, the screw revolution was 150 rpm, the vacuum degree of the vent was 3 kPa, and the extrusion temperature from the first feed port to the die was 320° C. The wholly aromatic polyamide fibers were supplied from the second feed port by using the side feeder of the above extruder, and the polyarylene sulfide resin was supplied into the extruder from the first feed port. The first feed port is a feed port farthest from the die, and the second feed port is situated between the die of the extruder and the first feed port. The obtained pellet was dried at 130° C. for 6 hours by means of a hot air circulation drier and formed into a test piece for evaluation by means of an injection molding machine. The evaluation results are shown in Table 2.

The TEX-30XSST of The Nippon Steel Works, Ltd. is a vented twin-screw extruder having one back feed screw element with a flight part having an arc-shaped cutout as shown in FIG. 2 of JP-A 2012-213997.

<Evaluation>

(1) Dynamic Friction Coefficient

The AFT-15M reciprocating dynamic friction abrasion tester of Orientec Co., Ltd. was used as an evaluation device. A pin-like test piece (material: steel) having a spherical surface at the end produced by bonding a hemisphere having a diameter of 5 mm to a column having a diameter of 5 mm and a length of 30 mm at their circular cross sections was attached to a fixing side test piece holder. Meanwhile, flat test pieces having a length of 150 mm, a width of 150 mm and a thickness of 2 mm (having a fin gate having a width of 40 mm and a thickness of 1 mm from the end of one side) were formed from the resin compositions of Examples and Comparative Examples by injection molding, center parts thereof were cut to a length of 50 mm and a width of 100 mm, and the obtained test pieces were fixed to a reciprocating pedestal. The spherical surface at the end of the above pin-like test piece was brought into contact with the flat part of each of the flat test pieces under a load of 9.8 N in such a manner that the axial direction of the column of the pin-like test piece became parallel to the normal direction of the flat plane of the flat test piece. In this contact state, they were reciprocated a one-way distance of 25 mm 1,000 times over one straight line within the plane at a speed of 2 seconds per reciprocation in an atmosphere having a temperature of 23° C. and a relative humidity of 50% RH to measure friction force after 1,000 times of operation with a 49 N load cell connected to the pin-like test piece in order to calculate the dynamic friction coefficient from the relationship with the above load. As this numerical value becomes smaller, the slidability of the resin composition becomes higher. The flat test pieces were formed at a cylinder temperature of 320° C. and a mold temperature of 130° C. by means of an injection molding machine (SG-150U of Sumitomo Heavy Industries, Ltd.).

(2) Impact Strength

The notched non-Charpy impact strength of a test piece (size: 00 mm in length×10 mm in width×4 mm in thickness) was measured by an ISO179-based method in an atmosphere having a temperature of 23° C. and a relative humidity of 50% RH. The test piece was formed under the same conditions as in (1) above. As this numerical value becomes larger, the impact resistance of the resin composition becomes higher.

<Components>

(Component A)

The same polyphenylene sulfide resins PPS-1 to PPS-5 as in Examples 1 to 12 and Comparative Examples 1 to 5 were used.

(Component C)
C-1: wholly aromatic polyamide fiber (manufactured by Teijin Limited: para-aramid fiber. T322UR, long diameter of 12 μm, cut length of 3 mm, urethane-based sizing agent)
C-2: wholly aromatic polyamide fiber (manufactured by Teijin Limited: para-aramid fiber T322EH, long diameter of 12 cut length of 3 mm, polyester-based sizing agent)
C-3: wholly aromatic polyamide fiber (manufactured by Teijin Limited: para-aramid fiber T324, long diameter of 12 μm, cut length of 3 mm, polyether sulfone-based sizing agent)
C-4: wholly aromatic polyamide fiber (manufactured by Teijin Limited: meta-aramid fiber ST2.2, long diameter of 12 μm, cut length of 1 mm, no sizing agent)
C-5: wholly aromatic polyamide fiber (manufactured by Teijin Limited: polyparaphenylene terephthalamide 1488, long diameter of 12 cut length of 6 mm, polyester-based sizing agent)

dried at 130° C. for 6 hours by means of a hot air circulation drier and formed into a test piece for evaluation by means of an injection molding machine. The evaluation results are shown in Table 3.

The TEX-30XSST of The Nippon Steel Works, Ltd. is a vented twin-screw extruder having one back feed screw element with a flight part having an arc-shaped cutout as shown in FIG. 2 of JP-A 2012-213997.

<Evaluation>
(1) Measurement of Fiber Length
200 mg of an evaluation test piece for measuring tensile strength was dissolved in 2 cc of 1-chloronaphthalene at 250° C. to separate solid matter with a membrane filter (made by PTFE, an opening size of 0.5 μm) by means of a pressure filtration apparatus manufactured by Senshu Scientific Co., Ltd. Then, the solid matter was washed twice with 2 cc of 1-chloronaphthalene at 250° C. and further with ethanol and dried with a vacuum drier to obtain solid matter.

TABLE 2

| | | Unit | Ex. 13 | Ex. 14 | Ex. 15 | Ex. 16 | Ex. 17 | Ex. 18 | Ex. 19 | Ex. 20 |
|---|---|---|---|---|---|---|---|---|---|---|
| Component A | PPS-1 | parts | 100 | 100 | 100 | 100 | 100 | 100 | 100 | 100 |
| | PPS-2 | by | | | | | | | | |
| | PPS-3 | weight | | | | | | | | |
| | PPS-4 | | | | | | | | | |
| | PPS-5 | | | | | | | | | |
| Component C | C-1 | parts | 25 | | | | | | | |
| | C-2 | by | | 12 | 25 | 45 | 120 | | | |
| | C-3 | weight | | | | | | 12 | 25 | 45 |
| | C-4 | | | | | | | | | |
| | C-5 | | | | | | | | | |
| Dynamic friction coefficient | | — | 0.31 | 0.47 | 0.31 | 0.15 | 0.09 | 0.45 | 0.33 | 0.30 |
| Impact strength | | kJ/m² | 29 | 18 | 38 | 45 | 80 | 14 | 16 | 19 |

| | | Unit | Ex. 21 | Ex. 22 | Ex. 23 | Ex. 24 | C. Ex. 6 | C. Ex. 7 | C. Ex. 8 | C. Ex. 9 |
|---|---|---|---|---|---|---|---|---|---|---|
| Component A | PPS-1 | parts | 100 | 100 | | | 100 | 100 | | |
| | PPS-2 | by | | | 100 | | | | | |
| | PPS-3 | weight | | | | 100 | | | | |
| | PPS-4 | | | | | | | | 100 | |
| | PPS-5 | | | | | | | | | 100 |
| Component C | C-1 | parts | | | | | | | | |
| | C-2 | by | | | 45 | 45 | 8 | 160 | | 12 |
| | C-3 | weight | | | | | | | 12 | |
| | C-4 | | 25 | | | | | | | |
| | C-5 | | | 25 | | | | | | |
| Dynamic friction coefficient | | — | 0.32 | 0.45 | 0.46 | 0.44 | 0.53 | Not extrudable | 0.52 | 0.55 |
| Impact strength | | kJ/m² | 13 | 13 | 12 | 12 | 6 | | 7 | 8 |

Ex.: Example

Examples 25 to 27, Comparative Examples 10 to 14

Amounts shown in Table 3 of a polyarylene sulfide resin and glass fibers were melt kneaded together by using a vented twin-screw extruder to obtain a pellet. The TEX-30XSST of The Nippon Steel Works, Ltd. (completely interlocking type, unidirectional rotation) was used as the vented twin-screw extruder. As for extrusion conditions, the delivery rate was 15 kg/h, the screw revolution was 250 rpm, the vacuum degree of the vent was 3 kPa, and the extrusion temperature from the first feed port to the die was 320° C. The glass fibers were supplied from the second feed port by using the side feeder of the extruder, and the polyarylene sulfide resin was supplied into the extruder from the first feed port. The first feed port is a feed port farthest from the die, and the second feed port is situated between the die of the extruder and the first feed port. The obtained pellet was The solid matter was dispersed in an aqueous solution containing 1% of a surfactant to measure the average fiber length by using a video microscope. The average fiber length was calculated as an average value of measurement data of 1,000 glass fibers.

(2) Tensile Strength
This was measured in accordance with ISO527-1&2 (measurement condition of 23° C.). A test piece was formed at a cylinder temperature of 320° C. and a mold temperature of 130° C. by means of an injection molding machine (SG-150U of Sumitomo Heavy Industries, Ltd.). The test piece was measured in an initial state and after PCT treatment. As the initial numerical value becomes larger and a reduction from the initial numerical value to the numerical value after PCT treatment becomes smaller, the resin composition becomes more excellent in moist heat resistance and mechanical strength.

(3) PCT Treatment

The test piece was treated at a temperature of 120° C. and a humidity of 100% for 100 hours by using the PC-305III/V pressure cooker tester of Hirayama Manufacturing Corporation.

<Components>
(Component A)

The same polyphenylene sulfide resins PPS-1 to PPS-5 as in Examples 1 to 12 and Comparative Examples 1 to 5 were used.

(Component D)

D-1: glass fiber (manufactured by Nippon Electric Glass Co., Ltd.: T-760H, cut length of 3 mm, fiber diameter of 10.5 μm, aminosilane/urethane/epoxy-based sizing agent)

D-2: glass fiber (manufactured by Nitto Boseki Co., Ltd.: CSG 3PA-830, cut length of 3 mm, irregular cross-sectional short diameter of 7 μm, irregular cross-sectional long diameter of 28 μm, irregular shape ratio of 4, epoxy-based sizing agent)

D-3: glass fiber (manufactured by Nippon Electric Glass Co., Ltd.: T-760H, cut length of 9 mm, fiber diameter of 10.5 μm, aminosilane/urethane/epoxy-based sizing agent)

TABLE 3

| | | Unit | Ex. 25 | Ex. 26 | Ex. 27 | C. Ex. 10 | C. Ex. 11 | C. Ex. 12 | C. Ex. 13 | C. Ex. 14 |
|---|---|---|---|---|---|---|---|---|---|---|
| Component A | PPS-1 | parts by weight | 100 | 100 | 100 | | 100 | 100 | | |
| | PPS-2 | | | | | | | | | |
| | PPS-3 | | | | | | | | | |
| | PPS-4 | | | | | 100 | | | 100 | |
| | PPS-5 | | | | | | | | | 100 |
| Component D | D-1 | parts by weight | 67 | | | 67 | 10 | | | 67 |
| | D-2 | | | 67 | | | | 210 | 67 | |
| | D-3 | | | | 67 | | | | | |
| Tensile strength | initial | MPa | 190 | 180 | 190 | 170 | 65 | 130 | 160 | 175 |
| | After PCT treatment | MPa | 175 | 165 | 175 | 120 | 30 | 100 | 110 | 140 |
| Average fiber length | | μm | 245 | — | 250 | 210 | — | — | — | 215 |

Effect of the Invention

When a polyarylene sulfide resin synthesized through a polymerization reaction using an aromatic disulfide-based compound as a polymerization terminator is used, affinity for carbon fibers lowers, whereby the residual fiber length of the carbon fibers contained in the resin is made large at the time of melt kneading, thereby making it possible to improve mechanical strength and electromagnetic shielding effect.

When the polyarylene sulfide resin synthesized by the above method is used, affinity for wholly aromatic polyamide fibers lowers, whereby the residual fiber length of the wholly aromatic polyamide fibers contained in the resin is made large at the time of melt kneading, thereby making it possible to improve slidability and impact strength.

When the polyarylene sulfide resin synthesized by the above method is used, affinity for glass fibers lowers, whereby the residual fiber length of the glass fibers contained in the resin is made large at the time of melt kneading, thereby making it possible to improve moist heat resistance and impact strength.

Therefore, the resin composition of the present invention is excellent in mechanical strength as well as electromagnetic shielding effect, slidability and moist heat resistance.

INDUSTRIAL APPLICABILITY

The resin composition of the present invention can be used in housings, trays, chassis and interior members for electric and electronic equipment, lighting equipment, amusement devices and toys.

Examples of the electric and electronic equipment include personal computers, displays, OA equipment, mobile phones, portable information terminals, facsimiles, compact disks, portable MDs, portable radio cassettes, PDAs (portable information terminals such as electronic diaries), video cameras, digital still cameras, optical equipment, audio equipment and air conditioners.

The resin composition of the present invention can be used in members and exterior boards for automobile- and two-wheeler-related parts, and cases.

Examples of the automobile- and two-wheeler-related parts include motor parts, alternator terminals, alternator connectors, IC regulators, potentiometer bases for light dimmers, suspension parts, valves such as exhaust gas valves, fuel-related, exhaust or suction pipes, air intake nozzle snorkels, intake manifolds, arms, frames, hinges, bearings, fuel pumps, gasoline tanks, CNG tanks, engine cooling water joints, carburetor main bodies, carburetor spacers, exhaust gas sensors, cooling water sensors, oil temperature sensors, brake pad wear sensors, throttle position sensors, crank shaft position sensors, air flow meters, brake pad abrasion sensors, air conditioner thermostat bases, hot air flow control valves, radiator motor brush holders, water pump impellers, turbine vanes, wiper motor-related parts, distributors, starter switches, starter relays, transmission wire harnesses, window washer nozzles, air conditioner panel switch boards, fuel-related electromagnetic valve coils, fuse connectors, battery trays, AT brackets, head lamp supports, pedal housings, handles, door beams, protectors, chassis, frames, armrests, horn terminals, step motor rotors, lamp sockets, lamp reflectors, lamp housings, brake pistons, noise shields, radiator supports, spare tire covers, seat shells, solenoid bobbins, engine oil filters, ignition cases, undercovers, scuff plates, pillar trims, propeller shafts, wheels, fenders, fascias, bumpers, bumper beams, bonnets, aero parts, platforms, cowl louvers, roofs, instrument panels, spoilers and various modules.

The resin composition of the present invention can also be used in aircraft-related parts and wind turbine blades. The aircraft-related parts include landing gear pads, winglets, spoilers, edges, ladders, elevators, fairings and ribs.

The resin composition of the present invention is useful as electronic equipment housings such as housings for computers, notebook computers, ultrabooks, tablets and mobile phones and inverter housings for hybrid cars and electric cars.

The invention claimed is:

1. A resin composition produced by melt kneading components consisting of:
   (A) 100 parts by weight of a polyarylene sulfide resin (component A) synthesized through a polymerization reaction using ingredients consisting of an aromatic disulfide-based compound as a polymerization terminator, a diiodoaryl compound and a sulfur compound, wherein the polymerization reaction excludes a reaction catalyst of 1,3-diiodo-4-nitrobenzene, and
   (B) 15 to 180 parts by weight of a carbon fiber (component B), based on 100 parts by weight of the component A,
   wherein the component B has an average fiber diameter of 5 to 13 μm and a fiber length of 60 to 500 μm.

2. The resin composition according to claim 1, wherein the aromatic disulfide-based compound is at least one selected from the group consisting of a benzothiazole and a diphenyl disulfide.

3. A molded article comprising the resin composition of claim 2.

4. The resin composition according to claim 1, wherein the aromatic disulfide-based compound is at least one selected from the group consisting of diphenyl disulfide and dithiobisbenzothiazole.

5. A molded article comprising the resin composition of claim 4.

6. The resin composition according to claim 1, wherein the component A is a polyarylene sulfide resin obtained by directly heating and polymerizing a diiodoaryl compound, solid sulfur and an aromatic disulfide-based compound without using a polar solvent.

7. A molded article comprising the resin composition of claim 6.

8. A molded article comprising the resin composition of claim 1.

9. The resin composition according to claim 1, wherein the composition has an electromagnetic shielding effect of 26 dB or more.

* * * * *